US005650041A

United States Patent [19]
Gotoh et al.

[11] Patent Number: 5,650,041
[45] Date of Patent: Jul. 22, 1997

[54] SEMICONDUCTOR DEVICE FABRICATION METHOD

[75] Inventors: Hideto Gotoh; Masaru Utsugi, both of Ibaraki-ken, Japan

[73] Assignee: Texas Instruments Incorporated, Dallas, Tex.

[21] Appl. No.: 485,541

[22] Filed: Jun. 7, 1995

[30] Foreign Application Priority Data

Jun. 17, 1994 [JP] Japan ................................. 6-159177

[51] Int. Cl.$^6$ .................................................. H01L 21/311
[52] U.S. Cl. .................................. 156/653.1; 156/662.1; 437/225; 134/1.3
[58] Field of Search ..................... 156/643, 662.1, 156/651.1, 653.1, 637.1; 134/1.3; 216/57; 437/225

[56] References Cited

U.S. PATENT DOCUMENTS

| | | | |
|---|---|---|---|
| 4,717,448 | 1/1988 | Cox et al. | 156/643 |
| 5,017,513 | 5/1991 | Takeuchi | 437/228 |
| 5,412,868 | 5/1995 | Nguyen et al. | 29/852 |
| 5,454,901 | 10/1995 | Tsuji | 156/643.1 |

FOREIGN PATENT DOCUMENTS

| | | | |
|---|---|---|---|
| 0 536 968 A2 | 4/1993 | European Pat. Off. | H01L 21/311 |
| 0 540 261 A2 | 5/1993 | European Pat. Off. | H01L 21/90 |
| 63-018631 | 1/1988 | Japan . | |
| 63-067736 | 3/1988 | Japan . | |
| 63-102373 | 5/1988 | Japan . | |
| 5-144775 | 6/1993 | Japan . | |
| 1819356 | 5/1993 | U.S.S.R. . | |

OTHER PUBLICATIONS

Solid State Technology, vol. 37, No. 1, 1 Jan. 1994, pp. 61/62, 64/65 XP000441035, R. A. Bowling, et al., "*MMST Wafer Cleaning*".

Semiconductor Science & Technology, vol. 8, No. 10, 1 Oct. 1993, pp. 1897–1903, XP000417423, S. J. Pearton, et al., "*Low Bias Dry Etching of Tungsten & Dielectric Layers on GaAs*".

Journal of the Electrochemical Society, vol. 139, No. 6, 1 Jun. 1992, pp. 1751–1756, XP000324426, O. J. Anttila, et al., "*Metal Contamination Removal on Silicon Wafers Using Dilute Acidic Solutions*".

*Primary Examiner*—R. Bruce Breneman
*Assistant Examiner*—George Goudreau
*Attorney, Agent, or Firm*—David S. Guttman; W. James Brady, III; Richard L. Donaldson

[57] ABSTRACT

An MLR (multilayer resist) 3 is formed on a BPSG layer 2 on top of a silicon wafer 1, then dry etched using an etching gas 8 to form a contact hole 2a on the BPSG layer 2. Next, the polymer residues 9a and 9b adhering to the side walls of the contact hole 2a and the surface of the BPSG layer 2 are subjected to a cleaning treatment using a cleaning treating liquid that contains 0.04–0.12 wt % hydrogen fluoride, thereby removing the polymer residues 9a and 9b.

During etching the presence of the polymer residue layer 9 prevents etching in the horizontal direction, thereby allowing the formation of a highly precise contact hole 2a. In addition, because the treating liquid has the composition described above, the aforementioned polymer residues 9a and 9b are removed, thereby avoiding any degradation of the electrical characteristics. In addition, corrosion of the side walls of the contact hole due to the cleaning treating liquid is prevented, thereby maintaining the high level of contact hole precision. As a result good electrical characteristics are ensured even if the structure has an ultrafine-pitch pattern.

3 Claims, 11 Drawing Sheets

0.10 wt % HF 0.10 wt % HF

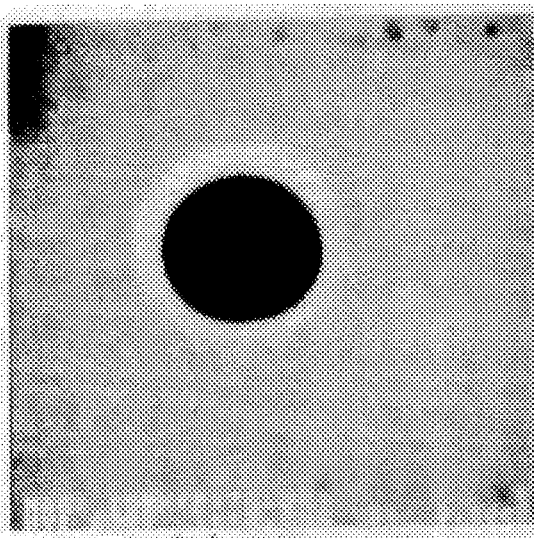
Fig. 3(a) 0.05 WT% HF
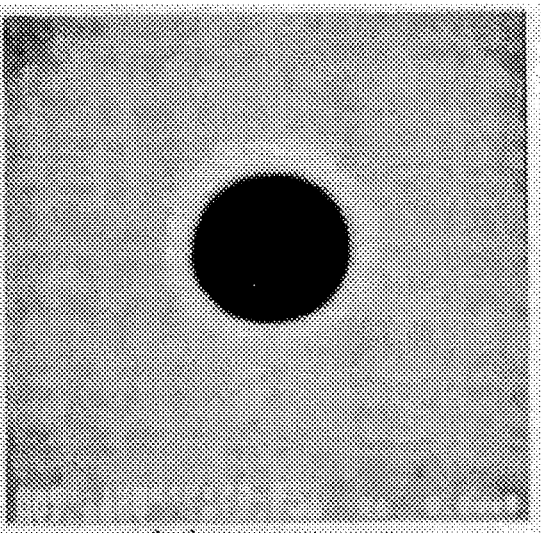
Fig. 3(b) 0.04 WT% HF
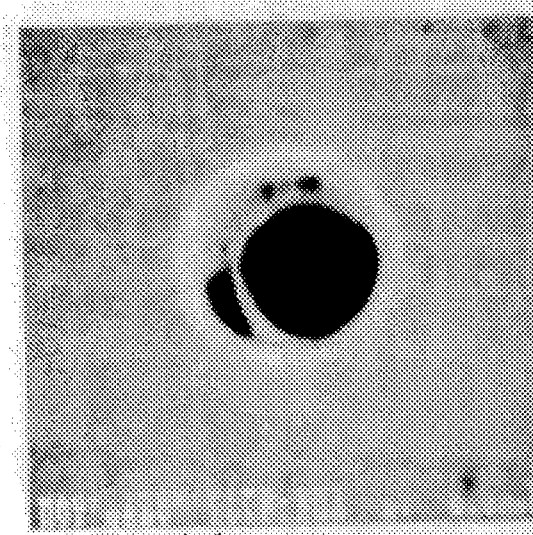
Fig. 3(c) 0.03 WT% HF
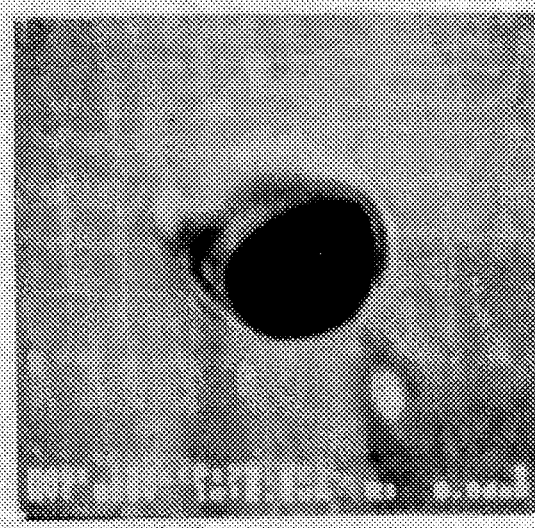
Fig. 3(d) 0.02 WT% HF
Fig. 3(e) WITHOUT HF

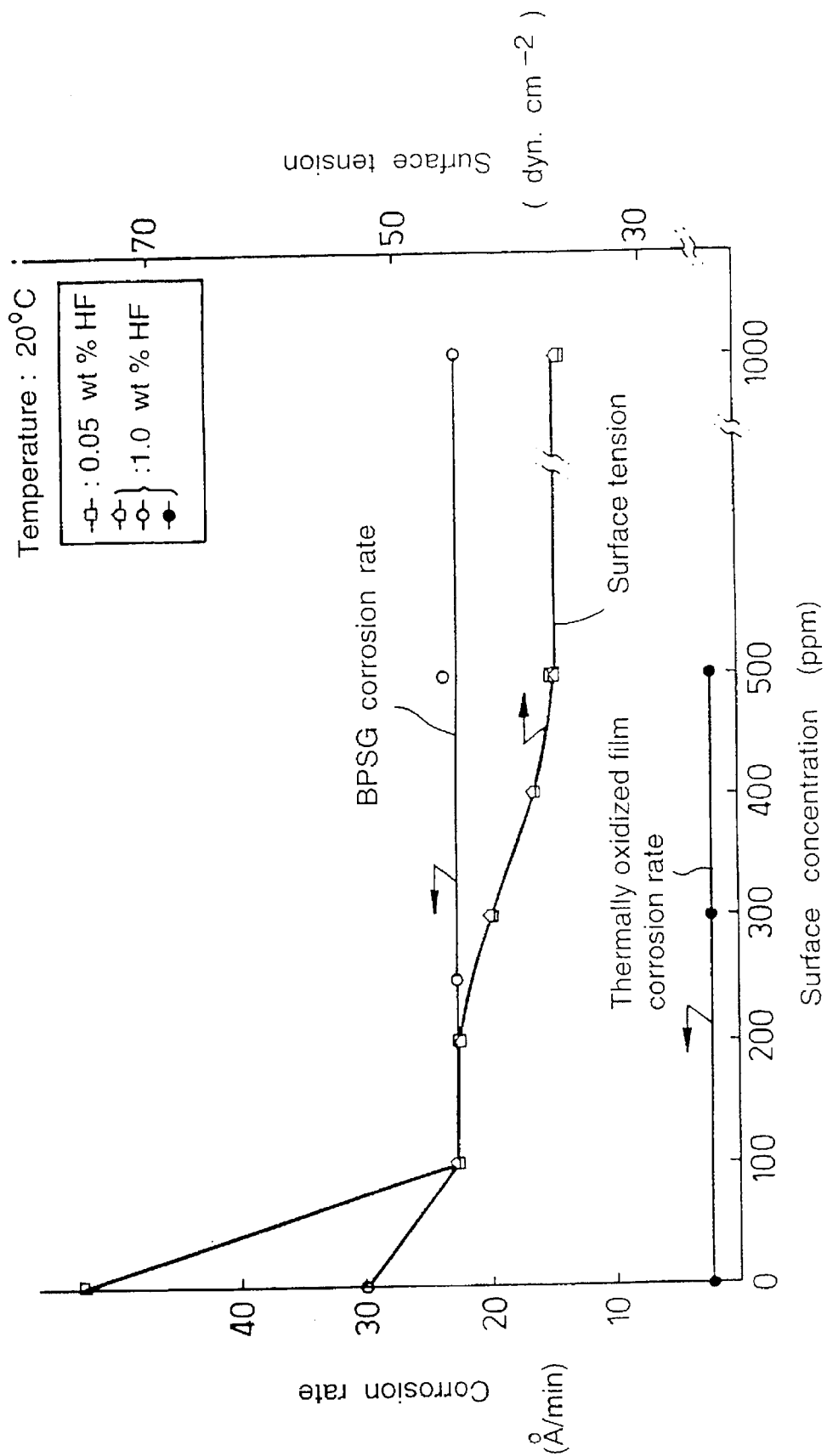

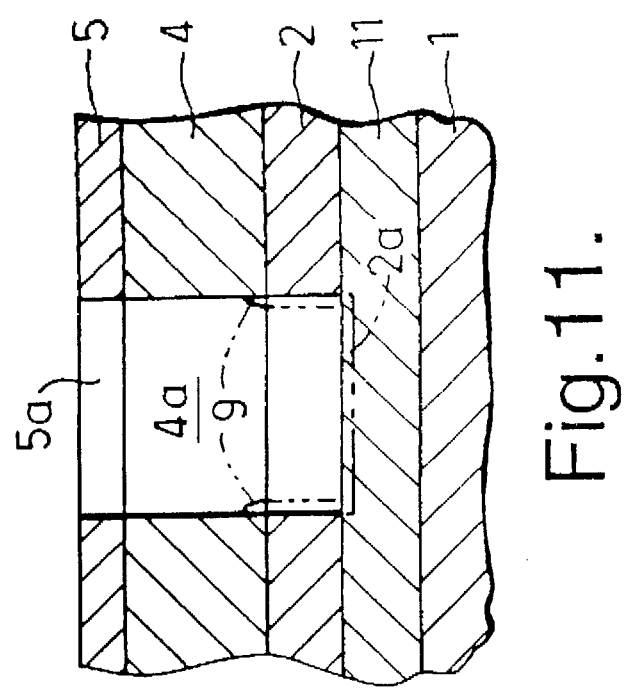

1

SEMICONDUCTOR DEVICE FABRICATION METHOD

FIELD OF THE INVENTION

The present invention pertains to a semiconductor device fabrication method and a treating liquid used with that method.

BACKGROUND OF THE INVENTION

The dimensions required in ultra-large-scale integrated circuits (ULSIs) for circuit element formation are extremely small, on the order of 0.5 μm. With wet etching, fine patterning of this kind involves forming a resist film in the prescribed pattern on the surface of the layer to be patterned. During the etching process, isotropic etching characteristics are exhibited. Thus, undercutting in the width direction takes place simultaneous with etching in the depth direction. Therefore it is difficult to obtain the desired dimensions. This method is therefore not suitable. In contrast, with dry etching, the amount of etching in the width direction is very small compared to the amount of etching in the width direction on the layer to be patterned. Therefore this is highly suitable for fine patterning such as that described above.

However, with dry etching, as the etching process progresses a residue (hereinafter referred to as "polymer residue" or "polymer residue layer") is created and deposited in the etched areas, containing components of the gas used in the etching process, structural components of the patterned layer (including the resist), and metal components (e.g., iron, chromium, and nickel as possible components) from structural parts of the etching equipment. This polymer residue layer cannot be removed by conventional plasma ashing [transliteration] or mixtures of sulfuric acid and hydrogen peroxide-water (these cleaners are used to remove organic contaminants and generally consist of a 3:1 mixture of concentrated sulfuric acid and 30% hydrogen peroxide-water). The presence of the polymer residue results in problems such as the following.

(1) As illustrated in FIG. 13, when a polymer residue layer 9 is formed on the side walls of a contact hole 92a on a BPSG (silicate glass doped with boron and phosphorous) 92, the area of contact between the silicon substrate 91 and the contact 93a on the wire 93 is reduced, causing an increase in the contact resistance. In addition, the contact 93a is connected to the substrate 91 through the polymer residue layer 9 as indicated by the broken-line arrow. This causes changes in the resistance.

(2) It becomes more difficult to adhere wiring materials to the insulating layer.

(3) The insulation provided by the interlayer insulating layer becomes unreliable.

(4) In addition to reduced reliability in the semiconductor devices of the final product, if the polymer residue layer contains metal components, they may contaminate production facilities, such as electric furnaces or cleaning equipment, in steps after patterning.

The present invention has been developed in light of the conditions described above, and has the objective of providing an ultrafine-pitch-patterned semiconductor device fabrication method and a treating liquid used with that method, whereby the undesirable polymer residue layer is removed to ensure good, stabilized electrical characteristics.

SUMMARY OF THE INVENTION

The present invention pertains to a semiconductor device fabrication method, that comprises a step wherein a mask is used to dry etch a prescribed pattern onto a lower layer, after which dry etching process the aforementioned lower layer is allowed to remain on the semiconductor substrate, wherein a mixed residue, resulting from the aforementioned lower layer, the resist, and the etching gas used in the aforementioned dry etching process, is treated using a treating liquid that contains 0.04–0.12 wt % hydrogen fluoride.

With the present invention, the lower layer can be an insulating layer, and a contact hole formation process can be performed by patterning the aforementioned lower layer.

In addition, with the present invention, the lower layer can be a conductive layer, which conductive layer can be allowed to remain as wiring after the etching process.

With the present invention the concentration of hydrogen fluoride in the treating liquid should be 0.04–0.12 wt %. It is even more preferable that it be 0.09–0.10 wt %.

The present invention also pertains to the aforementioned treating liquid.

As a result of intensive research, the inventors arrived at the present invention with the discovery that it is possible to perform patterning with a high level of precision when the undesirable polymer residue layer described above is instead [of being removed immediately] utilized during the dry etching patterning process. The methods for forming and treating the prescribed pattern utilizing anisotropic etching on the semiconductor substrate with this dry etching method will be described with reference to FIG. 12.

As shown in FIG. 12(a), a resist mask 83 is formed on an etched layer 82 on top of a nonetched layer 81. Next, as shown in FIG. 12(b), an etching gas 8 is supplied from the top of the resist mask 83 to a plasma atmosphere as indicated by the arrow in order to etch the area on the etched layer 82 beneath the opening 83a on the resist mask 83. The etching gas 8a in the vertical direction is used to pattern the etched layer 82 through the steps shown in FIGS. 12(c) and (d).

During this etching process a polymer residue layer 9 is formed on the side walls of the etched area 82a on the etched layer 82. The polymer residue layer 9 functions as a barrier wall against the etching gas 8b (indicated by the horizontal arrow) as [the gas] attempts to enter the side walls of the etched area. This prevents the etched area from expanding in the horizontal direction. Thus, the patterning is highly precise.

When the etched layer 82 patterning process ends as shown in FIG. 12(d), the resist mask 83 is removed, thereby completing the patterning process as shown in (e) of the same FIG. 12(e).

Next the remaining polymer residue layer shown in FIG. 12(e) is removed and the subsequent film formation step is entered. The process of removing this polymer residue layer will be described in detail in the embodiment section below. It should be noted that in FIG. 12 the etched layer 82 is an insulating layer. The patterning process whereby a contact hole is formed in this insulating layer is illustrated.

BRIEF DESCRIPTION OF THE DRAWINGS

FIG. 1 illustrates sketches of secondary electron images made with a scanning electron microscope of the surface of an insulating layer after forming the contact hole for the first embodiment.

FIG. 3 illustrates secondary electron images like that shown FIG. 1, of BPSG layers with various different concentrations of hydrogen fluoride in the cleaning treating liquid. FIG. 3(a) is a secondary electron image for a case (embodiment) using a hydrofluoric acid with a hydrogen fluoride concentration of 0.05 wt %; FIG. 3(b) pertains to a case (embodiment) using a hydrofluoric acid with a hydrogen fluoride concentration of 0.04 wt %; FIG. 3(c) pertains to a case (comparative example) using a hydrofluoric acid with a hydrogen fluoride concentration of 0.03 wt %; FIG. 3(d) pertains to a case (comparative example) using a hydrofluoric acid with a hydrogen fluoride concentration of 0.02 wt %; and FIG. 3(e) pertains to a case (comparative example) using a hydrofluoric acid containing no hydrogen fluoride.

FIG. 5 is a graph that illustrates the relationship between the amount of surfactant added to the cleaning treating liquid in the second embodiment, the BPSG layer corrosion rate, the contact hole width loss, and the surface tension on the cleaning treating liquid.

FIG. 11 is an enlarged cross section that illustrates the formation of a contact hole using a multilayer resist mask instead of the resist mask used in the third embodiment (the aforementioned FIG. 6).

1,71 is a silicon wafer; 2 is a BPSG layer; 2a,14 are contact holes; 3 is a multilayer resist (MLR); 4 is a lower resist mask layer; 5 is an intermediate mask layer; 6 is an upper resist mask layer; 7,13,18,76,83 are resist masks; 8,78 is a reaction gas; 9,79 are polymer residue layers; 9a,9b, 11 is a tungsten layer; 14 is a CVD oxide film; 16 is a thermally oxidized film; 17 is a polysilicon layer; 22,34 are n$^+$-type diffusion regions; 27 is a gate oxide film; 35,35R$_i$,35R$_2$, 35U$_1$,35U$_2$ are polysilicon gate electrodes (word lines); 47 is a buried n$^+$-type polysilicon contact layer; 51 is a field oxide film; 57 is a bit line; 60 is an active region; 62 is a contact hole; 63 is a field plate or plate electrode; 64 is a dielectric film; 65 is a storage node; 72 is an insulating layer; 73 is a lower conductive layer; 74 is an intermediate insulating layer; 75 is an upper conductive layer; 81 is a nonetched layer; 82 is an etched layer; 82a is an etched region; C1,Cap1,Cap2 are capacitors; CEL,CEL1,CEL2, CEL3 are memory cells; CEL-B is a memory cell block; Tr$_1$,Tr$_2$ are transistors.

DESCRIPTION OF THE EMBODIMENTS

Embodiments of the present invention will be presented below. All of the embodiments presented below pertain to a technology for patterning ULSIs such as 64 MB DRAMs.

Embodiment 1

FIG. 2 illustrates the process whereby a contact hole is formed in the BPSG layer on top of a monocrystalline silicon substrate (hereinafter referred to as "silicon wafer").

Figure 2A:
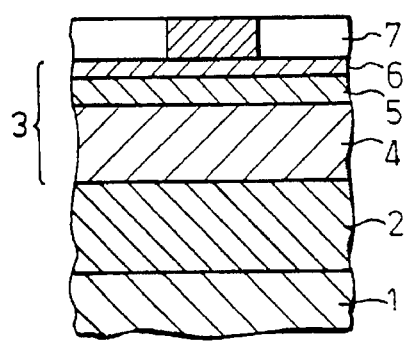
FIG. 2 is an enlarged cross section that illustrates the process of forming the aforementioned contact hole.

First, as shown in FIG. 2(a), a BPSG layer 2 with a thickness of 1 µm is formed on top of the silicon wafer 1 by means of a conventional film formation technology, after which an MLR (multilayer resist) 3 is applied thereon [onto the BPSG layer 2]. The MLR 3 consists of a lower resist mask layer 4 (with a thickness of 1.2 µm) consisting of a Novolak resin; an intermediate mask layer 5 (with a thickness of 0.2 µm) consisting of SOG (spin-on-glass; one type of organic glass); and an upper resist mask layer 6 (with a thickness of 0.3 µm) applied through a conventional resist application using a conventional negative or positive-type resist (a negative-type in this example).

Figure 2B:
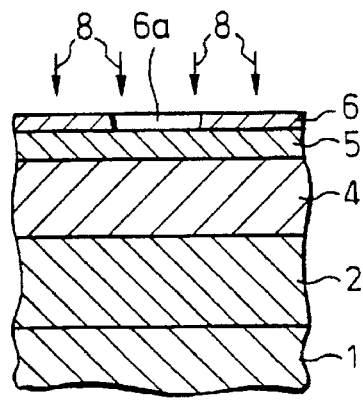

Next the upper resist mask layer 6 is exposed in the prescribed pattern by means of projection, etc. Next, a hole (6a) is formed on the upper resist mask layer 6 by means of a conventional development progress as shown in FIG. 2(b). The upper resist mask layer 6 is then used as a mask and the etching gas 8 is introduced. In this manner dry etching is performed in a plasma atmosphere to pattern the intermediate mask layer 5. At the end of this patterning process the upper resist mask layer 6 is removed by the etching gas 8. The dry etching conditions are described below.

Figure 2C:
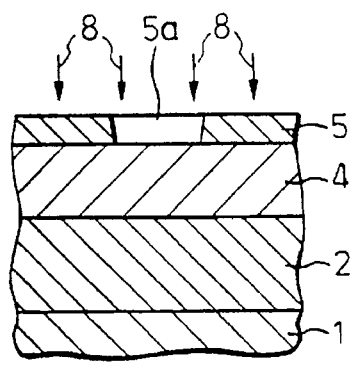

Next, as shown in FIG. 2(c), the etching gas 8 is introduced using the intermediate mask layer 5, on which a hole 5a was formed as described above, as a mask. In this manner the lower resist mask layer 4 is dry etched.

Figure 2D:
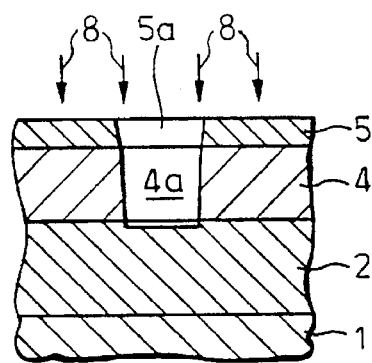

Thus, a hole 4a is formed on the lower resist mask layer 4 beneath the hole 5a on the intermediate mask layer 5 as shown in FIG. 2(d).

Figure 2E:
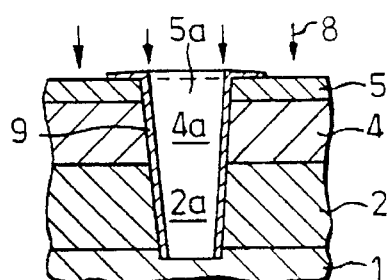

Next the lower resist mask layer 4 is used as a mask and the dry etching process is continued to form a contact hole 2a on the BPSG layer 2 beneath the hole 4a as shown in FIG. 2(e). In the processes shown in FIGS. 2(d) and (e), the polymer residue layer 9 is formed on the side walls of the holes 5a and 4a and the contact hole 2a.

Figure 2F:
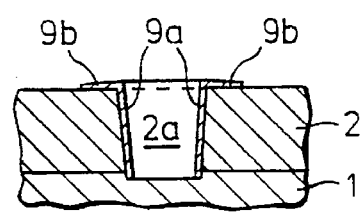

Next, the lower resist mask layer 4 and the intermediate mask layer 5 are removed. After they are removed the polymer residue layer 9a remains on the side walls of the contact hole 2a as shown in FIG. 2(f). In addition, polymer residue 9b from the polymer residue layer 9 shown in FIG. 2(e) adheres to the surface of the BPSG layer 2 in the area around the contact hole 2a.

Figure 2G:
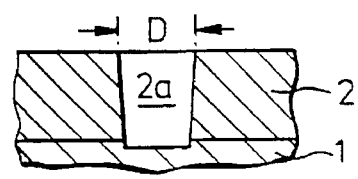

The polymer residues 9a and 9b are removed as shown in FIG. 2(g) by means of the cleaning treatment described below.

During the dry etching patterning process there is a slight slant with respect to the surface of the layer to be patterned. In addition, the side walls of the contact holes are corroded slightly in the process of removing the polymer residue layer 9a by means of the cleaning treatment described below. Thus, it is sufficient for the diameter D of the contact hole 2a to be only slightly larger than the diameter set in design. Incidentally, with 64 MB semiconductor devices there are severe constraints (a maximum of 0.02 µm) on the increase in contact hole diameter (or width), and on the loss of line width in the wiring with respect to figures set in design. The diameter D (0.416 µm) of the contact hole 2a in this example is a highly precise dimension relative to the 0.40 µm diameter set in design, and is thus satisfactory in terms of the aforementioned constraints.

Figure 2H:
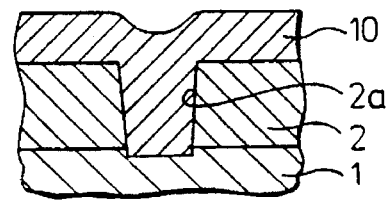

The contact hole formation process is completed through the steps shown in the aforementioned FIGS. 2(a)–(g). Next, as shown in FIG. 2(h), a conductive layer 10 is formed on top of the BPSG layer 2. In the next step a conductive layer 10 is patterned in the prescribed pattern by means of the same type of etching as that described above.

The dry etching process and the cleaning treatment used to remove the polymer residue were performed as described below.

Reactive ion etching, which has a high level of directivity, is a highly suitable type of dry etching. Reactive ion etching equipment was used to perform the process using $CHF_3$ and $CF_4$ as etching gases with the gas pressure set to $10^{-2}$ torr, the frequency at 13.56 MHz, and the wattage at 800 W. The time required for etching was 2 min.

During the dry etching process the polymer residue layer 9 was formed on the side walls of the holes as shown in FIG. 2(e), thereby preventing etching in the radial directions. As a result the high precision of the contact hole 2a was maintained. X-ray analysis showed that the polymer residue layer 9 composition consisted of C, O, Si, and F.

The polymer residue was removed in the following manner.

First a cleaning treating liquid containing 0.10 wt % hydrogen fluoride was prepared. Next, the silicon wafer shown in FIG. 2(f) was subjected to a cleaning treatment for 3 min. As described below, no polymer residue was noticed on the BPSG layer following the treatment.

The etching rate on the BPSG layer 2 shown in FIG. 2(g) with the aforementioned cleaning treatment was 49–50 Å min. The amount of film thickness lost was negligible. Etching rates such as these make it easier to control the cleaning treatment. It should be noted that among the layers forming the semiconductor devices in this example, the BPSG layer is the one with the fastest etching rate during the cleaning treatment.

Figure 1A:
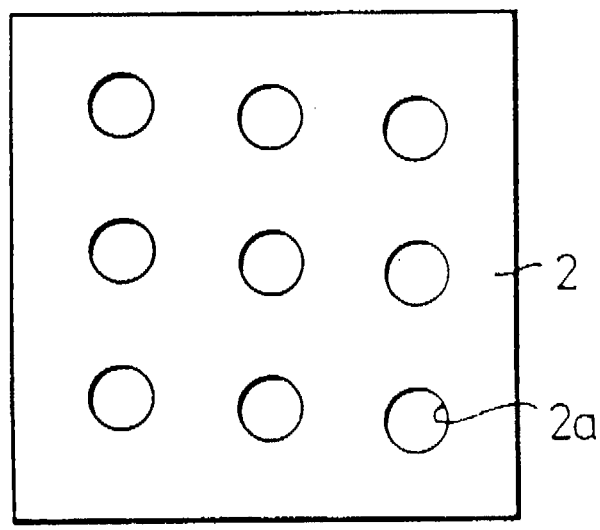
FIG. 1(a) illustrates the condition after the polymer residue is removed.
Figure 1B:
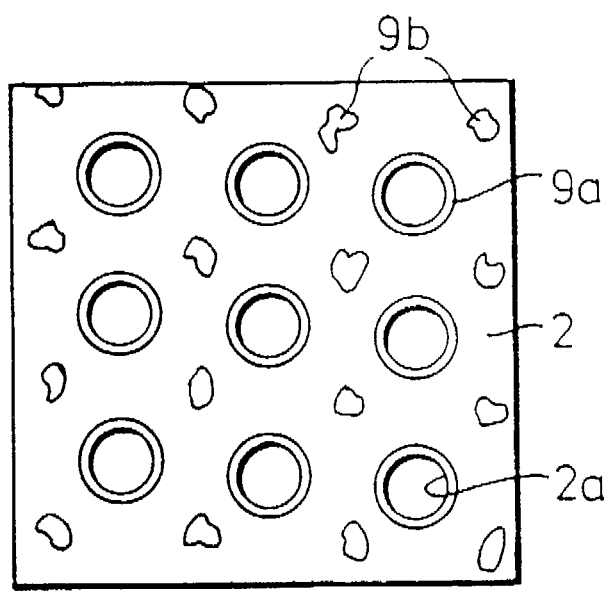
FIG. 1(b) illustrates the conditions before the polymer residue is removed.

FIG. 1 illustrates sketches of secondary electron images made with a scanning electron microscope of the surface of the BPSG layer after forming the contact hole. FIG. 1(a) illustrates the condition corresponding to FIG. 2(g) (after the polymer residue is removed), and FIG. 1(b) illustrates the condition corresponding to FIG. 2(f) (before the polymer residue is removed).

In FIG. 1(b), the polymer residue 9b is observed adhering to the surface of the BPSG layer 2. In contrast, in FIG. 1(a) (after the cleaning treatment), the polymer residue is not observed. Thus, FIG. 1 makes it clear that the polymer residue is completely removed by the aforementioned cleaning treatment. It should be noted that the polymer residue 9b shown in FIG. 1(b) cannot be removed by the aforementioned plasma etching or using a mixture of sulfuric acid and hydrogen peroxide-water.

FIG. 3 illustrates secondary electron images like that shown FIG. 1(a), in which the concentration of hydrogen fluoride in the cleaning treating liquid has been altered. In this case, the layer on which the contact hole is formed is not the BPSG layer but an MTO layer (this layer is obtained by reacting $SiH_4$ with $N_2O$ at approximately 800° C. through chemical vapor deposition (CVD) to generate $SiO_2$, which is then deposited on the silicon wafer).

FIG. 3(a) illustrates the results (for the embodiment) of a case in which a hydrofluoric acid containing 0.05 wt % hydrogen fluoride is used as the cleaning treating liquid. FIG. 3(b) illustrates the results (embodiment) for a case in which a hydrofluoric acid containing 0.04 wt % hydrogen fluoride is used as the cleaning treating liquid. FIG. 3(c) illustrates the results (comparative example) for a case in which a hydrofluoric acid containing 0.03 wt % hydrogen fluoride is used as the cleaning treating liquid. FIG. 3(d) illustrates the results (comparative example) for a case in which a hydrofluoric acid containing 0.02 wt % hydrogen fluoride is used as the cleaning treating liquid. FIG. 3(e) illustrates the results (comparative example) for a case in which a hydrofluoric acid containing no hydrogen fluoride is used as the cleaning treating liquid.

In FIG. 3(e) (0 wt % hydrogen fluoride), polymer residue 9b was observed in the form of a concentric circle around the contact hole 12a on the surface of the MTO layer 12. As the concentration of hydrogen fluoride is increased to 0.02 wt % (FIG. 3(d)) and 0.03 wt % (FIG. 3(c)), the amount of polymer residue 9b is reduced but is not eliminated completely. In contrast, when the concentration of hydrogen fluoride is 0.04 wt % (FIG. 3(b)) the amount of polymer residue remaining is extremely small and the effectiveness is very apparent. At 0.05 wt % (FIG. 3(a)) the polymer residue is completely removed and not observed at all.

The results presented above make it clear that the concentration of hydrogen fluoride in the cleaning treating liquid should be 0.04 wt % or greater. However, if the cleaning treating liquid used has an excessively high concentration of hydrogen fluoride, the etched layer will be corroded by the cleaning treating liquid, resulting in a larger increase in the contact hole diameter. The upper limit of the concentration of hydrogen fluoride in the cleaning treating liquid is 0.10 wt %; this was clarified in the following experiment.

Figure 4:
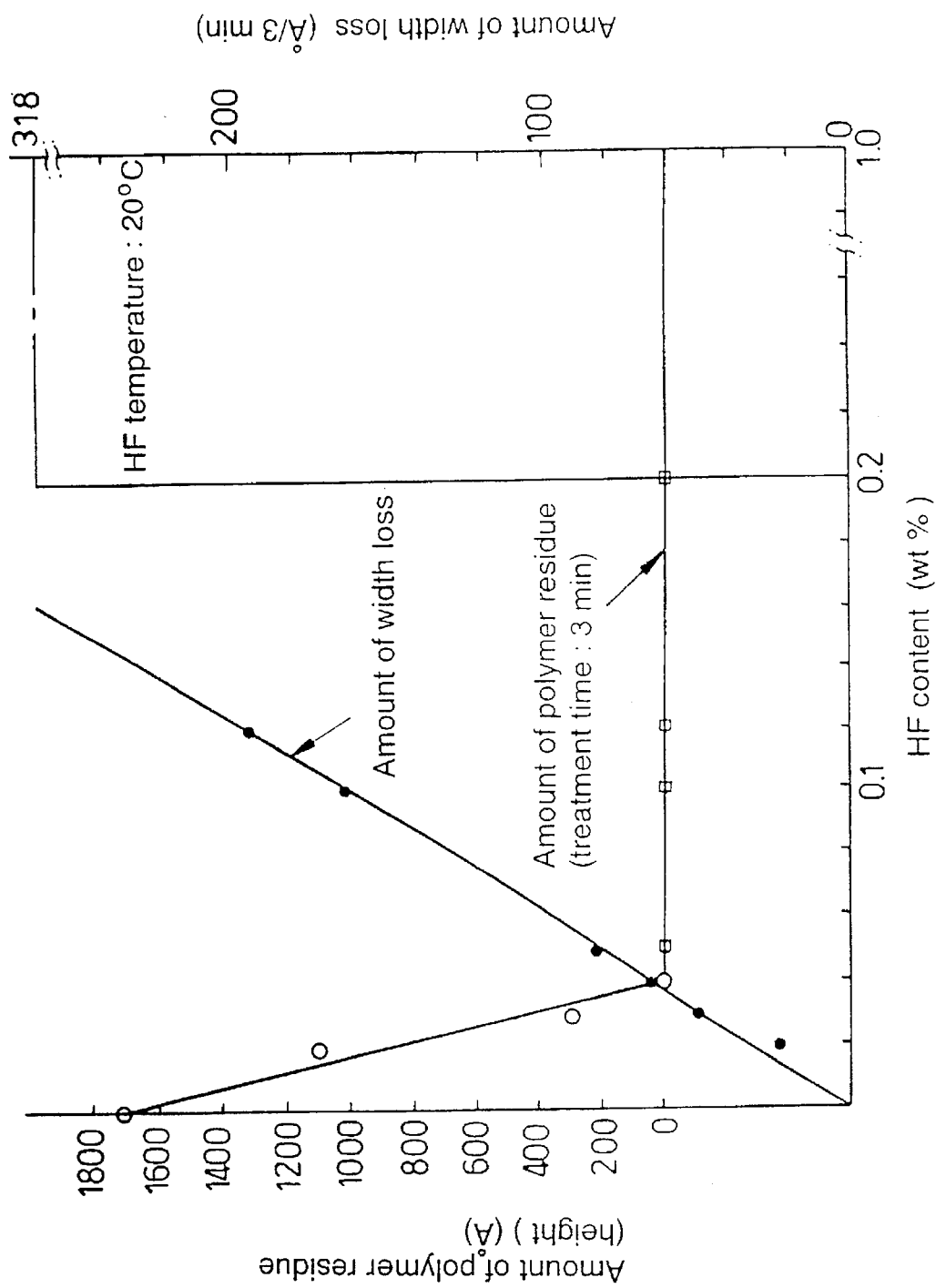
FIG. 4 is a graph that illustrates the relationship between the concentration of hydrogen fluoride in the aforementioned cleaning treating liquid, the amount of polymer residue remaining, and the loss in contact hole width.

The concentration of hydrogen fluoride in the cleaning treating liquid was varied as described above to determine the relationship between the concentration of hydrogen fluoride, the amount of polymer residue remaining on the etched layer, and the loss in contact hole width (i.e., the increase in diameter). The results shown in FIG. 4 were obtained.

Up to a hydrogen fluoride concentration of 0.05 wt % the amount of polymer residue is reduced as the concentration is increased. Beyond a hydrogen fluoride concentration of 0.05 wt %, however, [the reduction in the amount of polymer residue] is zero.

The lower the concentration of hydrogen fluoride, the smaller the loss of contact hole width becomes. At a concentration of 0.12 wt % or less, [the Loss reaches] the allowed limit of 0.02 μm or less. At a hydrogen fluoride concentration of 0.12 wt %, a point of inflection is observed. If this is exceeded the width loss exceeds 0.02 μm. At a hydrogen fluoride concentration of 1.0 wt % the width loss would exceed 0.1 μm. The results shown in FIG. 4 make it clear that the concentration of hydrogen fluoride in the cleaning treating liquid should be 0.12 wt % or less.

When reactive ion etching is used for patterning to form a contact hole in the BPSG layer or MTO layer, and a cleaning treatment is performed using hydrofluoric acid with a hydrogen fluoride concentration of 0.04–0.12 wt % as described above, the following benefits are obtained.

(1) The polymer residue layer created during the etching process serves as a barrier wall which prevents etching in the horizontal direction. Thus the patterning is highly precise.

(2) The polymer residue which would be obstructive in subsequent steps is reliably removed by the cleaning treatment.

(3) As a result good electrical characteristics are ensured and reliability is high.

(4) These benefits are extremely significant for ULSIs such as 64 MB DRAMs.

Embodiment 2

As a result of intensive research, the inventors have discovered that when a small amount of a surfactant is added to the hydrofluoric acid, surface tension is reduced, making it easier to control the cleaning treatment step for small areas such as contact holes.

500 ppm of a surfactant was added to hydrofluoric acid with a hydrogen fluoride concentration of 0.10 wt % for use as the cleaning treating liquid. The surfactant was a Nonion (product name; polyethylene glycol ether or ester) base surfactant.

The aforementioned cleaning treating liquid was used in a treatment to remove the polymer residue from a patterned BPSG layer, NSG layer, MTO layer, and thermally oxidized layer (this is a highly pure, highly insulating oxide layer, obtained by oxidizing a silicon wafer at a high temperature of at least 900° C. in an oxygen-enriched atmosphere, and used as gate oxide film or a field oxide film serving to separate elements from each other). The results were that the polymer residue was completely removed, as in the case described for Embodiment 1 above.

A nanometer-spec film thickness meter was used to determine the corrosion rate on each of the aforementioned layers, and to measure the surface tension on the cleaning treating liquid. The results are presented in the table below. The table also shows the results of similar measurements made on the following comparative examples to which no surfactant was added: hydrofluoric acid with a hydrogen fluoride concentration of 0.10 wt % and hydrofluoric acid with a 1.0 wt % hydrogen fluoride. (These were used on a different production line.) It should be noted that in all cases the temperature was set to 20° C.

TABLE

|  | Corrosion rate | | Thermally | Surface |
|---|---|---|---|---|
|  | BPSG layer | MTO layer | oxidized film | tension |
| Surfactant | 20 | 4 | 3 | 39 |
| 0.1 wt % HF | 53 | 4 | 3 | 75–76 |
| 1.0 wt % HF | 567 | — | 52 | 75–76 |

Note: The surface tension values were obtained at 20° C.

The amount of the aforementioned surfactant added to the hydrofluoric acids (with hydrogen fluoride concentrations of 0.04 wt % and 0.12 wt %) were varied to determine the corresponding changes in the liquid surface tension, contact hole width loss, and BPSG layer corrosion rate. The results shown in FIG. 5 were obtained.

FIG. 5 makes it clear that when 100 ppm of the surfactant are added, the etching rate stabilizes for BPSG, whereas the value for the thermally oxidized film is constant regardless of the amount added. Other experiments showed that when a large amount of a surfactant is added, part of it adheres to the treated wafer as a solid. Therefore it is preferable to set an upper limit of 500 ppm on additions to the treating liquid.

Embodiment 3

In this example a contact hole was formed on a CVD oxide film of silicon dioxide functioning as an interlayer insulating layer that was applied to wiring obtained through the patterning of a layer of tungsten, which does not oxidize easily. FIG. 6 illustrates the processes of forming the contact hole and removing the polymer residue.

Figure 6A:
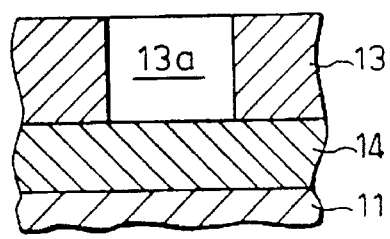
FIG. 6 is an enlarged cross section that illustrates the process of forming a contact hole in the third embodiment.

FIG. 6(a) illustrates the condition resulting when a CVD oxide film (14) with a thickness of 0.8 μm on top of tungsten wiring (11) was coated with a resist mask (13) serving to form the contact hole, after which the hole (13a) was formed by means of a conventional developing method.

Figure 6B:
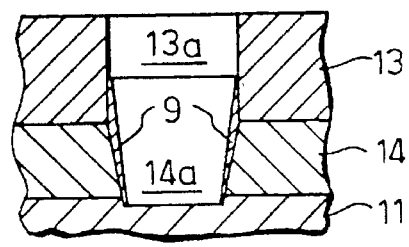

As shown in FIG. 6(b), reactive ion etching equipment was used to introduce the reaction gas (8) through the resist mask (13) in order to form a contact hole (14a) on the CVD oxide film (14) beneath the hole (13a) of the resist mask, in the same manner as in Embodiment 1 described above. During this process a polymer residue layer (9) was formed on the bottom part of the side walls of the resist mask hole (13a), and on the side walls of the contact hole (14a).

Figure 6C:
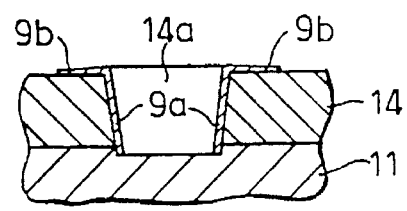

Next the resist mask was cleaned off and removed by ashing and with a resist remover (an organic solvent) as shown in FIG. 6(c). This resulted in a condition in which polymer residues (9a) and (9b) adhered respectively to the side walls of the contact hole (14a) and on top of the CVD oxide film (14).

Figure 6D:
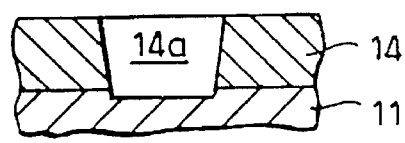

Next a cleaning treatment was performed using a hydrofluoric acid with a hydrogen fluoride concentration of 0.04–0.12 wt % (0.10 wt % in this example) to remove the polymer residue as shown in FIG. 6(d). The polymer residue was completely removed by this treatment, and there was essentially no reduction in the CVD oxide film (i.e., reduction in thickness). The diameter of the contact hole set in design was 0.40 μm and the diameter of the actual contact hole (14a) was 0.416 μm. Thus, the difference between them was very small and well within the permitted range.

Figure 6E:
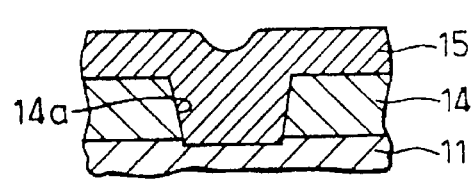

Next a second wiring material was formed as a film on top of the CVD oxide film 14 as shown in FIG. 6(e), and the second wiring material layer (tungsten layer) 15 was connected with the tungsten wiring 11 through the contact hole 14a.

As described above, the formation of a highly precise contact hole and the reliable removal of the polymer residue ensure good electrical characteristics.

Embodiment 4

This example pertains to a case in which a polysilicon layer formed on top of a thermally oxidized film is patterned. The polysilicon is used as the wiring material. FIG. 7 illustrates the processes of patterning the polysilicon layer and removing the polymer residue.

Figure 7A:
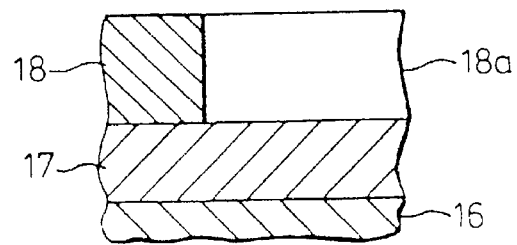
FIG. 7 is an enlarged cross section that illustrates the process of forming a contact hole in the fourth embodiment.

FIG. 7(a) illustrates the conditions resulting when a polysilicon layer 17, formed to a thickness of 0.1 μm on top of a thermally oxidized film 16, is covered with a patterning resist mask 18, and a hole 18a is formed by means of a conventional developing method.

Figure 7B:
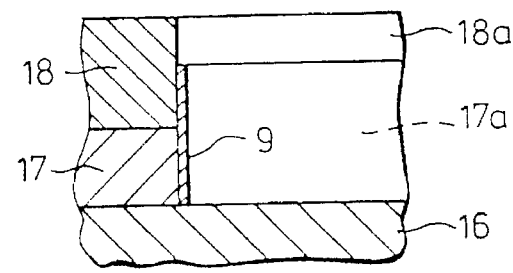

As shown in FIG. 7(b), reactive ion etching equipment is used to introduce the reaction gas 8 through the resist mask 18 for etching the area below the resist mask hole 18a on the polysilicon layer 17 in the same manner as in the aforementioned Embodiment 1. During this process a polymer residue layer 9 is formed on the lower part of the side walls of the resist mask hole 18a and on the side walls of the polysilicon layer 17.

Figure 7C:
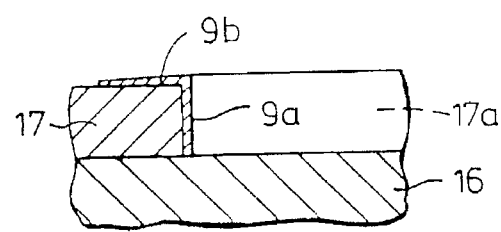

Next the resist mask was cleaned off and removed by plasma ashing and with a mixture of sulfuric acid and hydrogen peroxide-water as shown in FIG. 7(c). As described above the polymer residue 9 cannot be removed with a mixture of sulfuric acid and hydrogen peroxide-water. It should be noted that the cleaning treatment using the mixture of sulfuric acid and hydrogen peroxide-water lasts 20 min per cleaning. Thus, the resulting condition was one in which polymer residues 9a and 9b adhered respectively to the side walls and surface of the polysilicon layer 17.

Figure 7D:
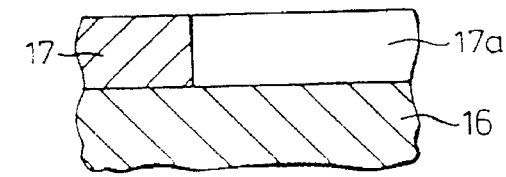

Next a cleaning treatment was performed using a hydrofluoric acid with a hydrogen fluoride concentration of 0.04–0.12 wt % (0.10 wt % in this example) to remove the polymer residue as shown in FIG. 7(d). The polymer residue was completely removed by this treatment. After patterning and removing the polymer residue, the pattern on the polysilicon layer exhibited a line width loss of approximately 160 Å, which is well within the permitted range.

It should be noted that the polymer residue was likewise completely removed when 500 ppm of a surfactant were added to the aforementioned hydrofluoric acid for use as the treating liquid.

Embodiment 5

This embodiment pertains to a case in which DRAM memory cells were formed using a variety of layers patterned as in the aforementioned Embodiments 1–4.

Figure 8:
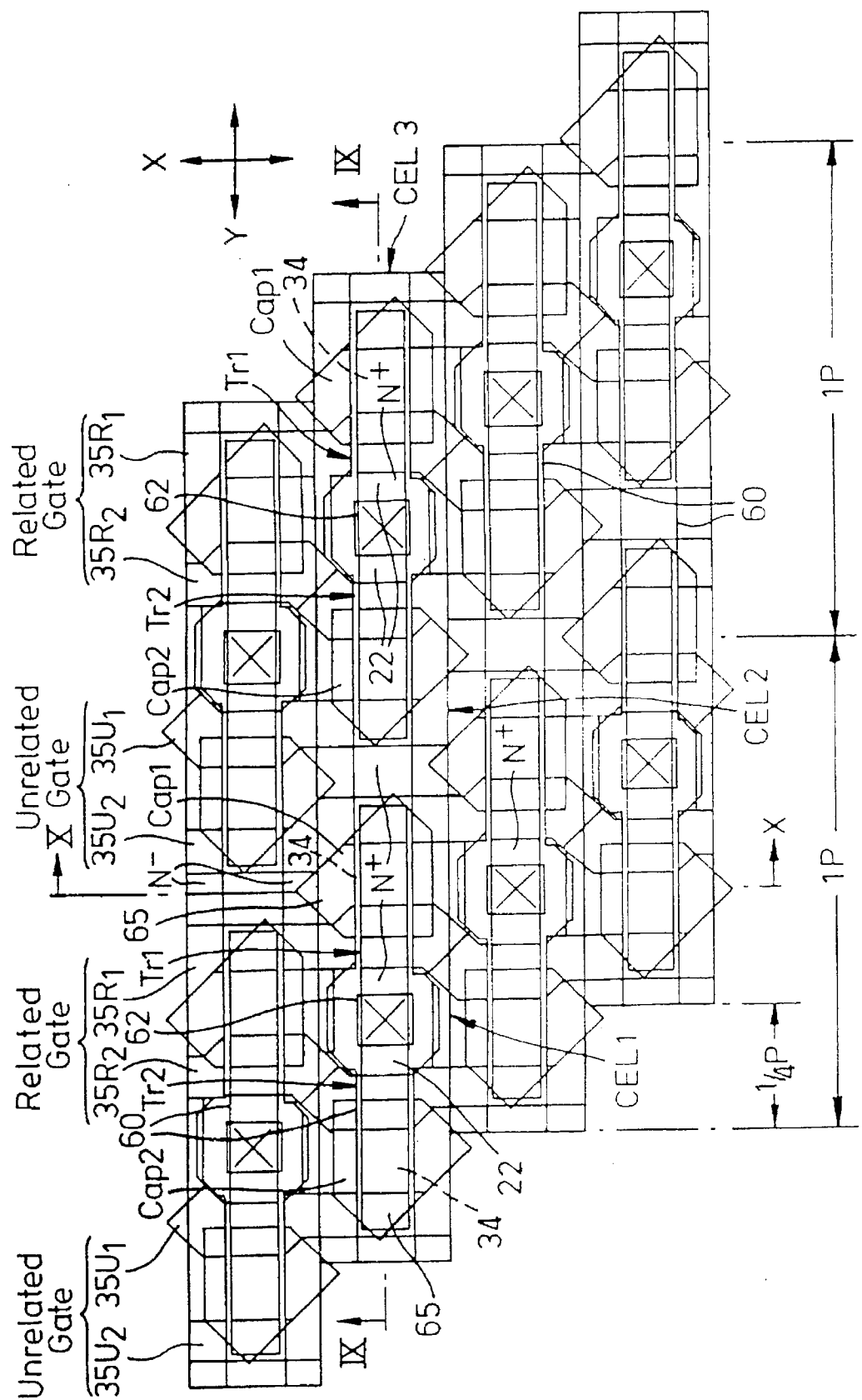
FIG. 8 is an enlarged plan view of the major components of the DRAM (dynamic RAM) memory cells of the fifth embodiment.
Figure 9:
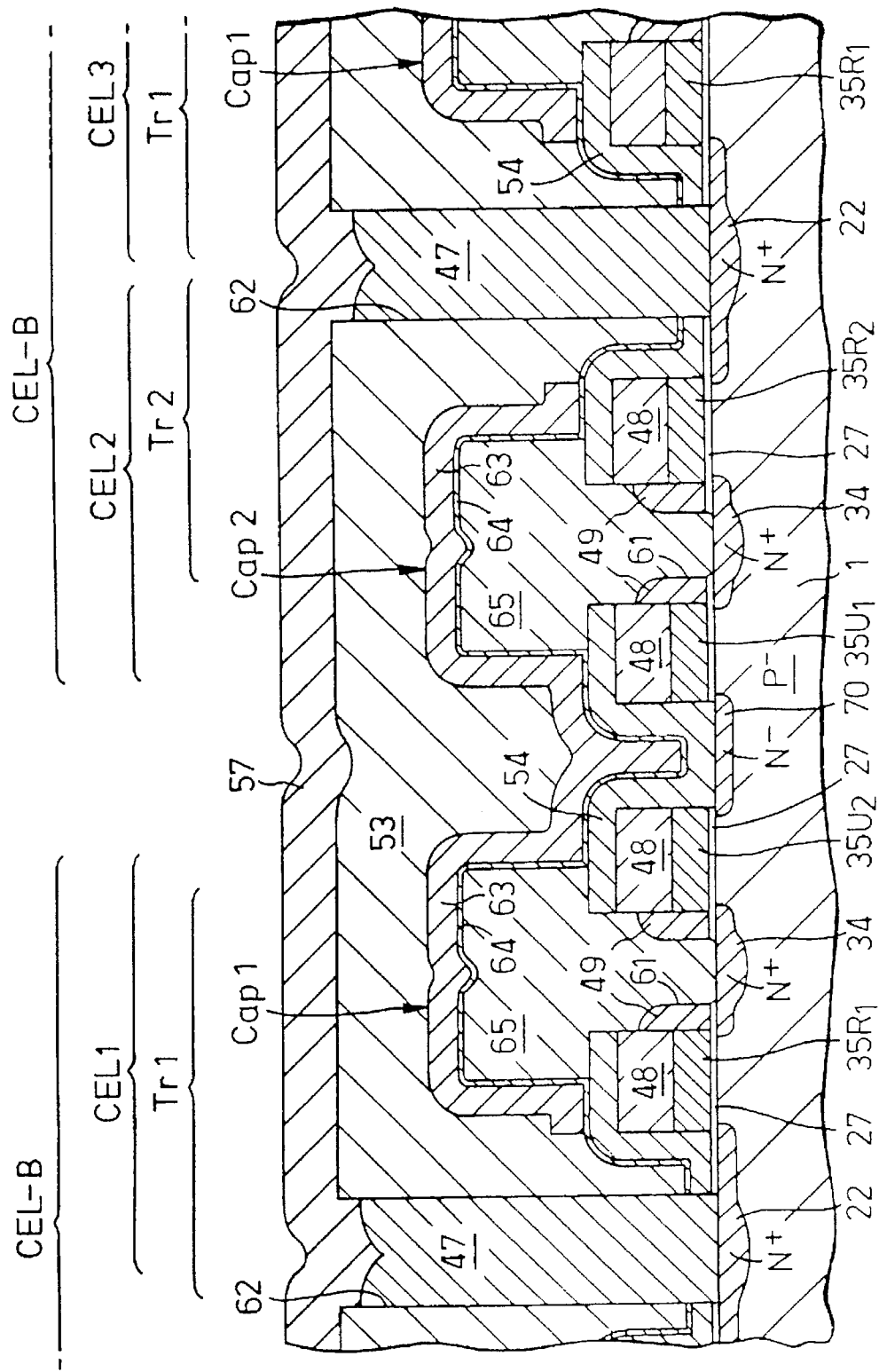
FIG. 9 is an enlarged cross section of the aforementioned memory cells (cross section along line IX—IX in FIG. 8).
Figure 10:
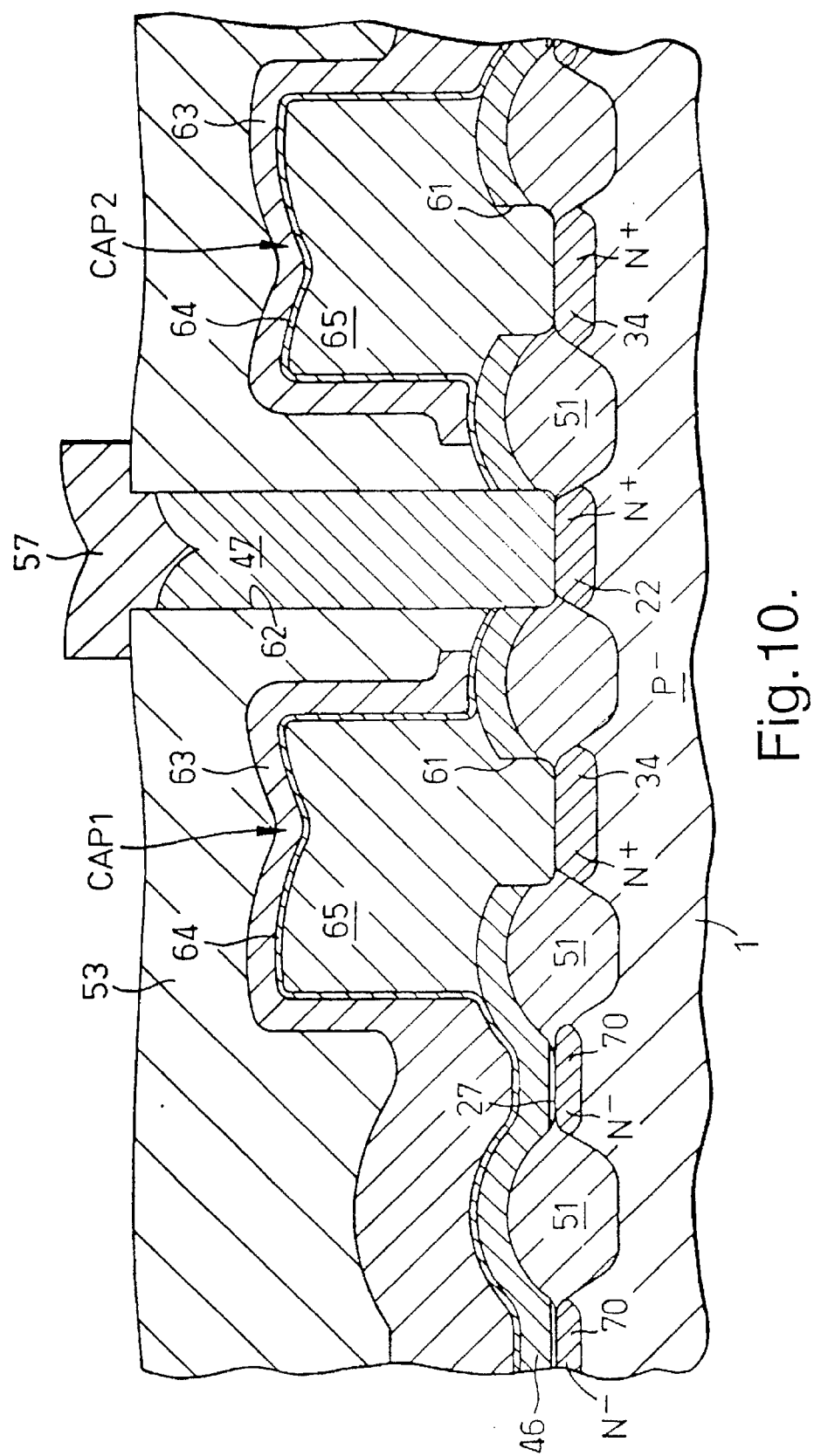
FIG. 10 is an enlarged cross section of the aforementioned memory cells (cross section along line X—X in FIG. 8).
Figure 12A:
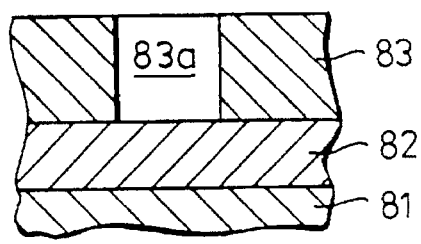
FIG. 12 is an enlarged cross section that illustrates the process whereby the generated polymer residue layer is used in high-precision patterning during the dry etching patterning process.
Figure 12B:
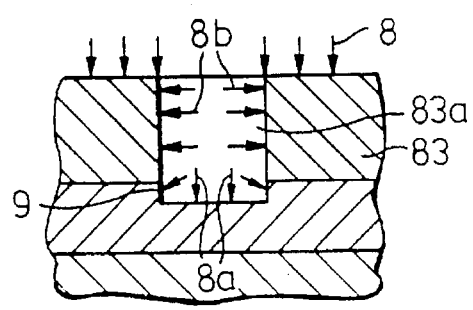
Figure 12E:
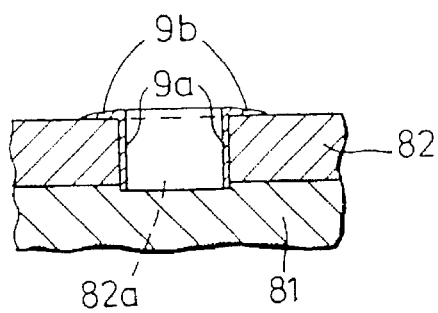
Figure 12C:
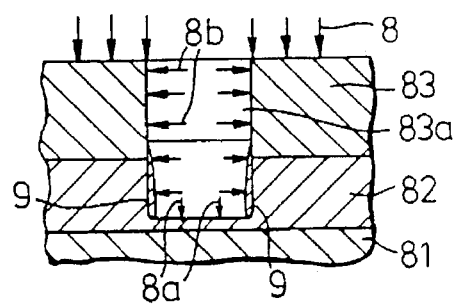
Figure 13:
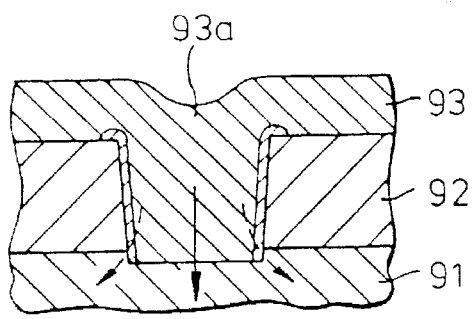
FIG. 13 is an enlarged cross section of the area surrounding a contact hole in a conventional comparative example.
Figure 12D:
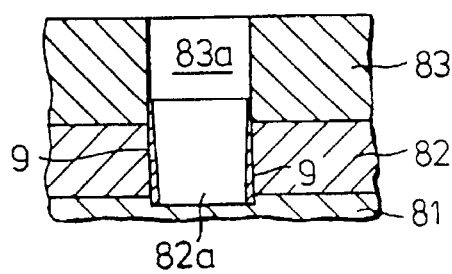

FIG. 8 is an enlarged view of the major components of the DRAM memory cells of this example. FIG. 9 is an enlarged cross section along line IX—IX in FIG. 8. FIG. 10 is an enlarged cross section along line X—X in FIG. 8.

As shown in FIG. 9, $n^+$-type diffusion regions 22 and 34 were formed on the main surface of a $p^-$-type silicon substrate (more specifically, a $p^-$-type well (1) formed on the silicon substrate). An n-channel insulated gate field-effect transistor (transfer gate) $Tr_1$ was formed by the $n^+$-type diffusion regions 22 and 34 and a polysilicon gate electrode (35 $R_1$). In addition, an n-channel insulated gate field-effect transistor (transfer gate) $Tr_2$ was formed by the $n^+$-type diffusion regions 22 and 34 and a polysilicon gate electrode (35 $R_2$). The $n^+$-type diffusion region 22 functions as a drain and the $n^+$-type diffusion region 34 functions as a source. In the figure, 48 represents an $SiO_2$ layer, 49 represents a nitride layer, 53 and 54 represent oxide films (interlayer insulating layers), and 46 represents a contact layer.

A bit line 57 is formed on the interlayer insulating layer 53. The bit line 57 is connected to the $n^+$-type diffusion region 22 through a polysilicon layer 47 buried in the contact hole 62 of the interlayer insulating layer 53.

In addition, as shown in FIG. 10, in the X-direction which is perpendicular to the lengthwise direction (Y-direction) of an active region 60, the individual active regions are insulated from each other by the field oxide film 51. In addition, parasitic channels are prevented from occurring by a plate electrode 63.

In this example the various layers were patterned according to the methods presented above for Embodiments 1–4, using dry etching and a subsequent polymer residue removal step. With layer structures that are complex and have an extremely fine pitch, such as the memory cells of the 64 MB DRAMs mentioned above, the patterning method of the present invention ensures that patterning is accurate so that highly reliable DRAM memory cells can be obtained.

Embodiments of the present invention were presented above. It should be noted that it is also possible to make various alterations to the aforementioned embodiments, based on the technical ideas of the present invention.

For example, although the example shown in FIG. 6 pertains to a case in which a single-layer resist mask was used to form the contact hole on the insulating layer, it is possible to instead use an MLR consisting of three layers as in the example shown in FIG. 2. FIG. 11 illustrates this step, which corresponds to FIG. 2(d).

The wiring 11, obtained through the patterning of a layer of tungsten (molybdenum, chromium, and other metals are also permissible), is adhered to the silicon wafer 1, and the BPSG layer 2 is adhered thereon (onto the wiring). On top of the BPSG layer 2, the upper mask layer is removed from the MLR, allowing the lower resist mask layer 4 and intermediate mask layer 5 to remain in sequence. Holes 4a and 5a are formed in the lower resist mask layer 4 and intermediate mask layer 5, respectively.

When the etching gas is introduced in the condition shown in FIG. 11, the contact hole 2a is formed on the BPSG layer 2 as indicated by the broken line. The polymer residue layer 9 is generated on the side walls of the contact hole 2a. Next the intermediate mask layer 5 and the lower resist mask layer 4 are removed, and the polymer residue is removed using the same treating liquid as that described above.

In addition to a surfactant, other suitable components may also be added to the cleaning treating liquid.

In addition to reactive ion etching, dry etching patterning may also be performed by means of cylindrical plasma etching or ion beam etching.

Ion beam etching is especially good for accurate patterning because it provides a high level of directivity.

In addition to the materials presented in the embodiments for use in forming the wiring (conductive layer) and insulating layer, it is possible to use other suitable materials.

In addition to memory cells in 64 MB DRAMs, the present invention can also be applied to the manufacture of various other semiconductor devices.

With the present invention the layer beneath the resist mask is dry etched, and the residue resulting from the etching gas is treated using a treating liquid that contains 0.04–0.12 wt % hydrogen fluoride. Thus, the presence of the aforementioned residue during the patterning processes prevents etching in undesirable directions, ensuring a high level of patterning precision. In addition, because the aforementioned treating liquid has the composition described above, the aforementioned residue is essentially removed, thereby avoiding any degradation to the electrical characteristics due to the aforementioned residue. In addition, the patterned layer is not corroded during the aforementioned treatment. Thus, the high level of patterning precision is maintained.

As a result, good electrical characteristics are ensured even if the structure has an ultrafine-pitch pattern. Thus, highly reliable semiconductor devices can be obtained.

We claim:

1. A method of fabricating a semiconductor device, comprising the steps of:

providing a semiconductor substrate;

disposing an insulating layer on the substrate;

disposing a resist layer having holes as a mask layer on the insulating layer;

exposing the resist layer to dry etching to produce corresponding contact holes passing through the insulating layer and indenting the substrate;

removing the mask layer;

applying a liquid acid comprising 0.04–0.12 wt % hydrogen fluoride to the insulating layer and the contact holes to remove any residue created during the dry etching process remaining on the insulating layer and in the contact holes without substantially widening the contact holes; and depositing a conductive material as a layer on the insulating layer and in the contact holes.

2. The method of claim 1 wherein the insulating layer consists essentially of BPSG.

3. The method of claim 1 wherein the insulating layer consists essentially of MTO.

* * * * *